(12) United States Patent
Liu (10) Patent No.: US 12,308,800 B2
(45) Date of Patent: May 20, 2025

(54) CIRCUIT CHIP WITH POWER SUPPLY NOISE REJECTION

(71) Applicant: REALTEK SEMICONDUCTOR CORP., Hsinchu (TW)

(72) Inventor: Li-Chen Liu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 548 days.

(21) Appl. No.: 17/691,240

(22) Filed: Mar. 10, 2022

(65) Prior Publication Data

US 2023/0163727 A1 May 25, 2023

(30) Foreign Application Priority Data

Nov. 25, 2021 (TW) .................................. 110144087

(51) Int. Cl.
*H03F 1/26* (2006.01)
*H03F 3/45* (2006.01)

(52) U.S. Cl.
CPC ........... *H03F 1/26* (2013.01); *H03F 3/45071* (2013.01)

(58) Field of Classification Search
CPC .............................. H03F 1/26; H02M 3/33571
See application file for complete search history.

(56) References Cited

U.S. PATENT DOCUMENTS

| 5,712,772 | A | * | 1/1998 | Telefus | .................. | H02M 3/01 363/21.02 |
| 11,722,128 | B2 | * | 8/2023 | Martin | .................. | G11C 29/023 713/502 |
| 2007/0195559 | A1 | * | 8/2007 | Gong | ................ | H02M 3/33507 363/21.01 |
| 2012/0250369 | A1 | * | 10/2012 | Furukawa | ......... | H02M 3/33584 363/25 |
| 2013/0195165 | A1 | * | 8/2013 | Poulton | ................. | H04L 25/028 375/297 |
| 2018/0317029 | A1 | * | 11/2018 | Larsen | ................. | H04R 25/505 |
| 2022/0094318 | A1 | * | 3/2022 | Dal Bianco | ......... | H02M 1/0025 |
| 2022/0343855 | A1 | * | 10/2022 | Shang | .................... | G11C 19/28 |
| 2022/0399818 | A1 | * | 12/2022 | Zhao | ................. | H02M 3/33523 |

FOREIGN PATENT DOCUMENTS

CN 112087132 A 12/2020

* cited by examiner

*Primary Examiner* — Patricia T Nguyen (74) *Attorney, Agent, or Firm* — Birch, Stewart, Kolasch & Birch, LLP (57) ABSTRACT

A circuit chip with power supply noise rejection includes a switch unit, an energy storage unit, and an operating circuit. The switch unit has a first connection terminal and a second connection terminal. The first connection terminal is adapted to receive a power supply voltage. The switch unit is configured to selectively turn on a first connection path between the first connection terminal and the second connection terminal according to a clock signal. The energy storage unit is coupled to the second connection terminal. When the switch unit turns on the first connection path, the energy storage unit is configured to generate a storage voltage on the second connection terminal according to the power supply voltage. The operating circuit is coupled to the second connection terminal, and the operating circuit is configured to operate according to the storage voltage.

10 Claims, 7 Drawing Sheets

CIRCUIT CHIP WITH POWER SUPPLY NOISE REJECTION

CROSS-REFERENCE TO RELATED APPLICATION

This non-provisional application claims priority under 35 U.S.C. § 119(a) to Patent Application No. 110144087 filed in Taiwan, R.O.C. on Nov. 25, 2021, the entire contents of which are hereby incorporated by reference.

BACKGROUND

Technical Field

The present invention relates to noise rejection technologies, and in particular, to a circuit chip with power supply noise rejection.

Related Art

Conventionally, in order to reject power supply noise of a power supply voltage, the power supply noise is filtered out by a low-pass filter including a resistor and a capacitor. However, the resistor usually occupies a large area in the layout of a chip. Especially in a circuit design that requires low frequency, a resistor with a relatively large resistance value is required, which results in a larger layout area for the resistor. In addition, the setting of the resistor also causes a settling time required by the power supply voltage to be excessively long.

SUMMARY

The present invention provides a circuit chip with power supply noise rejection. In an embodiment, the circuit chip with power supply noise rejection includes a switch unit, an energy storage unit, and an operating circuit. The switch unit has a first connection terminal and a second connection terminal. The first connection terminal of the switch unit is adapted to receive a power supply voltage. The switch unit is configured to selectively turn on a first connection path between the first connection terminal and the second connection terminal according to a clock signal. The energy storage unit is coupled to the second connection terminal of the switch unit. When the switch unit turns on the first connection path, the energy storage unit is configured to generate a storage voltage on the second connection terminal according to the power supply voltage. The operating circuit is coupled to the second connection terminal and is configured to operate according to the storage voltage.

Detailed features and advantages of the present invention are described in detail in the following implementations, and the content of the implementations is sufficient for a person skilled in the art to understand and implement the technical content of the present invention. A person skilled in the art can easily understand the objectives and advantages related to the present invention according to the contents disclosed in this specification, the claims and the drawings.

DETAILED DESCRIPTION

To make the objectives, features, and advantages of the embodiments of the present invention more comprehensible, the following provides detailed descriptions with reference to the accompanying drawings.

Figure 1:
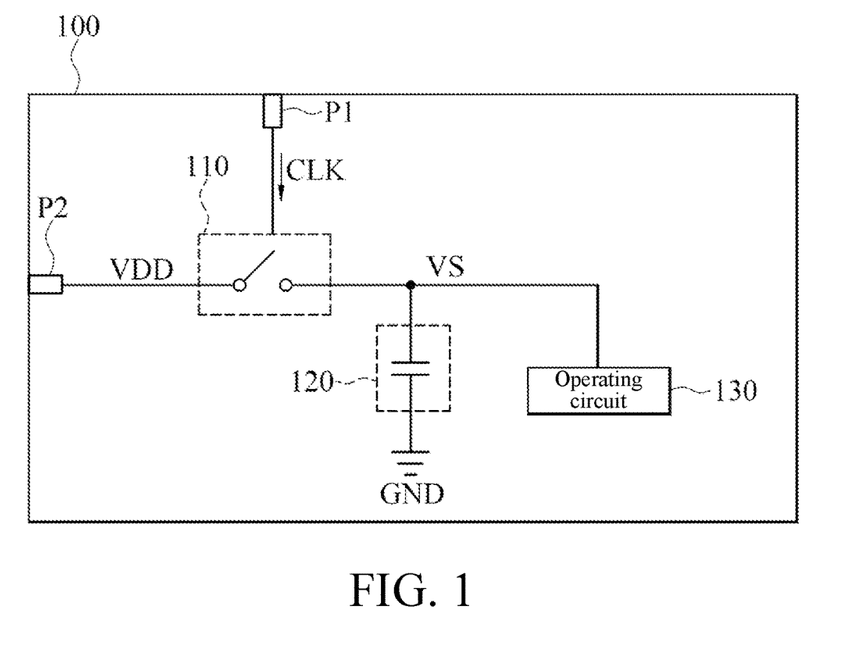
FIG. 1 is a schematic diagram of an embodiment of a circuit chip with power supply noise rejection.

FIG. 1 is a schematic diagram of a circuit chip 100 with power supply noise rejection. Referring to FIG. 1, the circuit chip 100 with power supply noise rejection includes a switch unit 110, an energy storage unit 120, and an operating circuit 130. The switch unit 110 has a first connection terminal, a second connection terminal, and a clock control terminal. The first connection terminal of the switch unit 110 is adapted to receive a power supply voltage VDD. The clock control terminal of the switch unit 110 is adapted to receive a clock signal CLK. The energy storage unit 120 is coupled between the second connection terminal of the switch unit 110 and a ground voltage GND. In addition, the operating circuit 130 is coupled to the second connection terminal of the switch unit 110.

The switch unit 110 is configured to selectively turn on a first connection path between the first connection terminal and the second connection terminal according to the clock signal CLK received by the clock control terminal. The energy storage unit 120 is configured to store energy when the first connection path is turned on, and is used, when the first connection path is not turned on, as a voltage source according to electric energy stored by the energy storage unit 120. In addition, the operating circuit 130 may operate by using the voltage provided by the energy storage unit 120.

In some embodiments, the switch unit 110 may turn on the first connection path according to the clock signal CLK. For example, the switch unit 110 may turn on the first connection path when a logic value of the clock signal CLK is "1". When the first connection path is turned on, the first connection terminal of the switch unit 110 may be electrically connected to the second connection terminal, and the power supply voltage VDD on the first connection terminal is transmitted to the second connection terminal, so that the energy storage unit 120 may generate storage electric energy according to the power supply voltage VDD, and a storage voltage VS is generated on the second connection terminal by the storage electric energy.

In addition, the switch unit 110 may cut off (i.e., disconnect) the first connection path according to the clock signal CLK. For example, the switch unit 110 may cut off the first connection path when a logic value of the clock signal CLK is "0". When the first connection path is cut off, the first connection terminal of the switch unit 110 is not electrically connected to the second connection terminal, and the power supply voltage VDD on the first connection terminal is not transmitted to the second connection terminal. In this case, the energy storage unit 120 may be used as a voltage source of the operating circuit 130 according to the storage electric energy stored by the energy storage unit 120, and the operating circuit 130 may operate by using the storage voltage VS that is on the second connection terminal and that is provided by the energy storage unit 120.

It is noted that how the switch unit 110 selectively turns on the first connection path according to the clock signal CLK may be determined depending on design requirements, which is not limited to the foregoing embodiments. For example, the switch unit 110 may alternatively cut off the first connection path when the logic value of the clock signal CLK is "1", and turn on the first connection path when the logic value of the clock signal CLK is "0".

In some embodiments, power supply noise exists in the power supply voltage VDD. The circuit chip 100 of the present invention may control the switch unit 110 to temporarily turn on the first connection path by using the clock signal CLK, so that the power supply voltage VDD with the power supply noise is temporarily transferred to the second connection terminal, to allow the energy storage unit 120 to generate storage electric energy, and the circuit chip 100 controls the switch unit 110 to cut off the first connection path by using the clock signal CLK again, so that the power supply voltage VDD with the power supply noise cannot be transmitted to the second connection terminal. In this way, the power supply noise of the power supply voltage VDD may be transmitted to the second connection terminal only when the first connection path is turned on, so that power supply noise of the storage voltage VS on the second connection terminal of the energy storage unit 120 may be greatly reduced to achieve a power supply noise rejection effect. In addition, the operating circuit 130 that operates according to the storage voltage VS of the energy storage unit 120 may have a good power supply rejection ratio (PSRR) due to the low power supply noise of the storage voltage VS. Furthermore, compared with a design that uses a conventional low-pass filter including a resistor and a capacitor to filter out power supply noise, a large layout area is saved in the circuit chip 100 of the present invention because no resistor is required, and an excessively long settling time caused by a large resistor can be avoided.

In some embodiments, the amount of power supply noise rejected by the circuit chip 100 is related to a duty cycle of the clock signal CLK. Specifically, a smaller duty cycle of the clock signal CLK indicates that the circuit chip 100 rejects a larger amount of power supply noise. For example, when the duty cycle of the clock signal CLK is 10%, power supply noise of the storage voltage VS may be 10% of the power supply noise of the power supply voltage VDD.

In some embodiments, the switch unit 110 may include at least one transistor. In addition, the energy storage unit 120 may include at least one capacitor. In some embodiments, the transistor may be implemented by, but not limited to, a metal-oxide-semiconductor field-effect transistor (MOSFET), a bipolar junction transistor (BJT), a GaN FET, or an insulated-gate bipolar transistor (IGBT).

Figure 2:
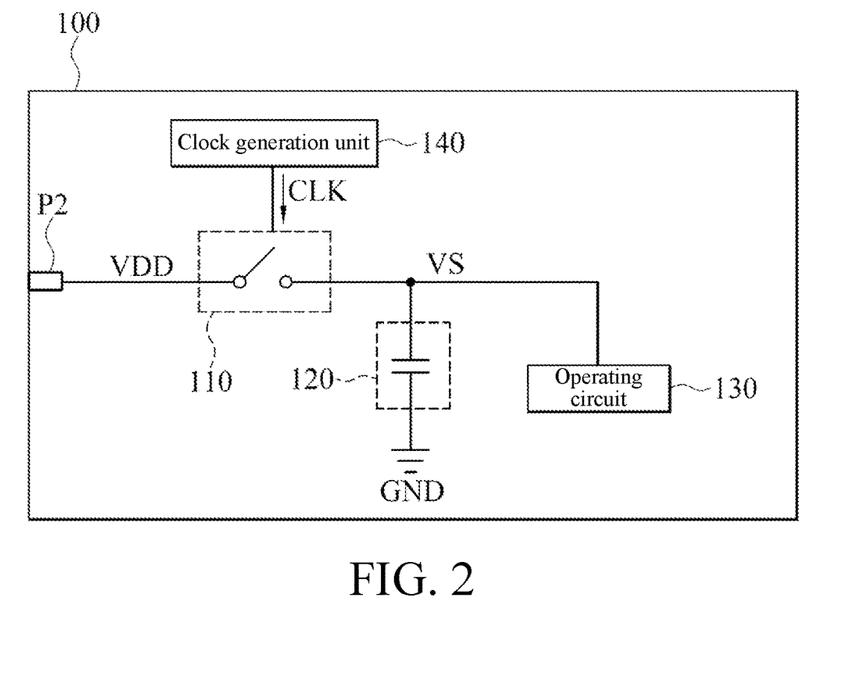
FIG. 2 is a schematic diagram of an embodiment of a circuit chip with power supply noise rejection.

FIG. 2 is a schematic diagram of an embodiment of a circuit chip 100 with power supply noise rejection. Referring to FIG. 2, in some embodiments, the clock signal CLK may be generated by an internal component of the circuit chip 100. Herein, the circuit chip 100 may further include a dock generation unit 140. The clock generation unit 140 is coupled to the clock control terminal of the switch unit 110, and the clock generation unit 140 is configured to generate a clock signal CLK to the switch unit 110. In some embodiments, the clock generation unit 140 may be, but is not limited to, an oscillator, a clock generator, or the like.

Referring to FIG. 1, in some other embodiments, the clock signal CLK may alternatively be generated by an external component of the circuit chip 100 and inputted to the circuit chip 100. Herein, the circuit chip 100 may further include a clock input pin P1. The clock input pin P1 is coupled to the clock control terminal of the switch unit 110, and the clock input pin P1 is configured to receive the clock signal CLK inputted from the outside of the circuit chip 100 to the switch unit 110. In some embodiments, the external component that generates the clock signal CLK may be, but is not limited to, a signal generator.

Figure 3:
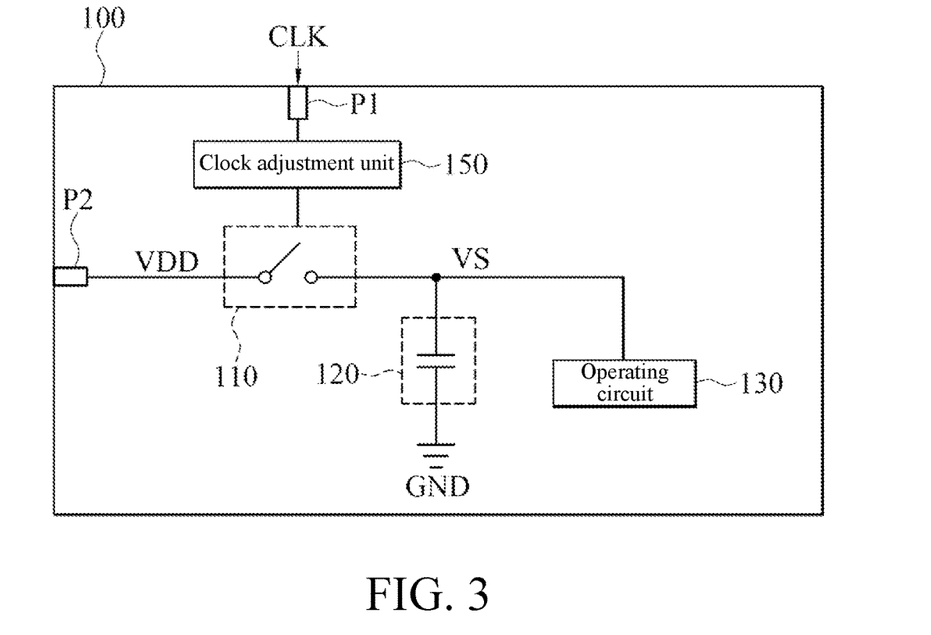
FIG. 3 is a schematic diagram of an embodiment of a circuit chip with power supply noise rejection.
Figure 4:
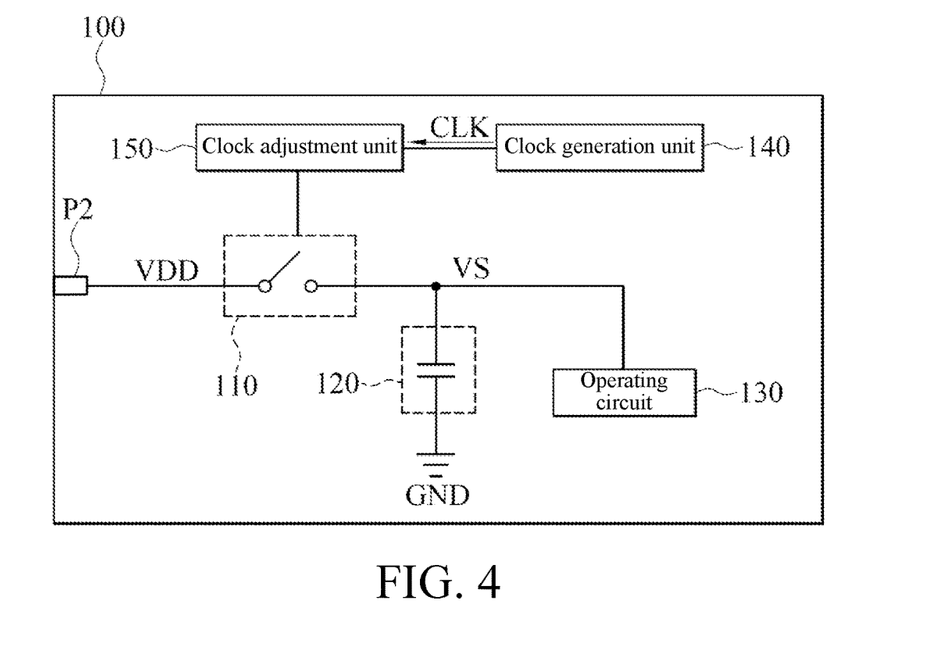
FIG. 4 is a schematic diagram of an embodiment of a circuit chip with power supply noise rejection.
Figure 5:
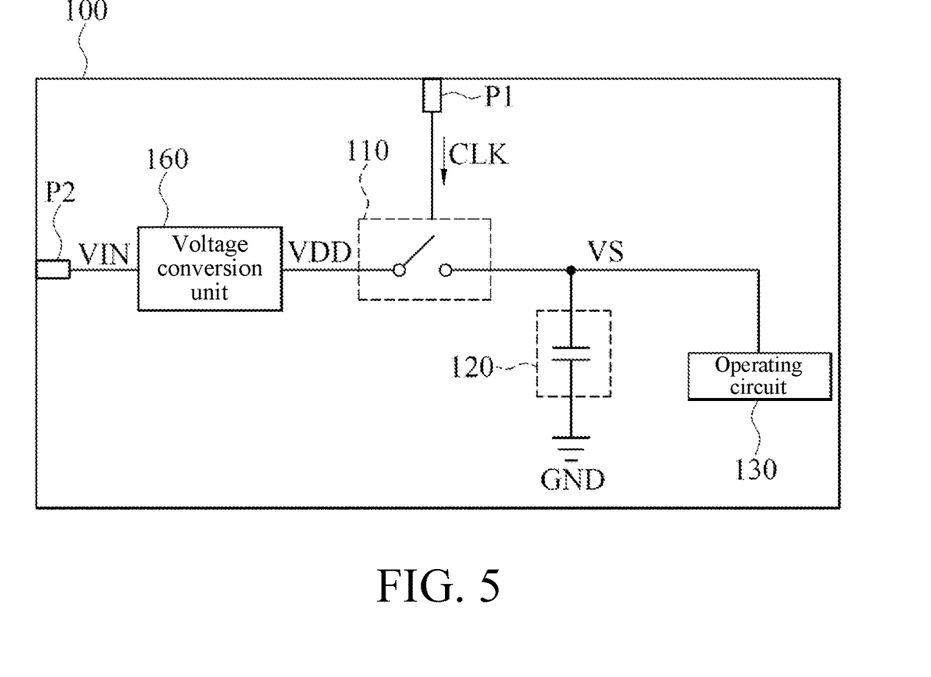
FIG. 5 is a schematic diagram of an embodiment of a circuit chip with power supply noise rejection.
Figure 6:
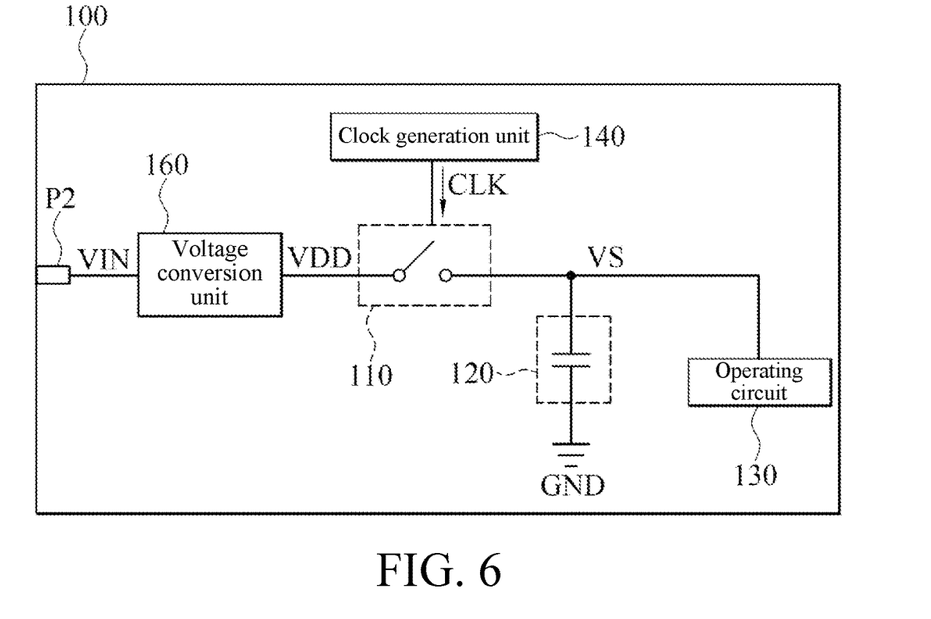
FIG. 6 is a schematic diagram of an embodiment of a circuit chip with power supply noise rejection.
Figure 7:
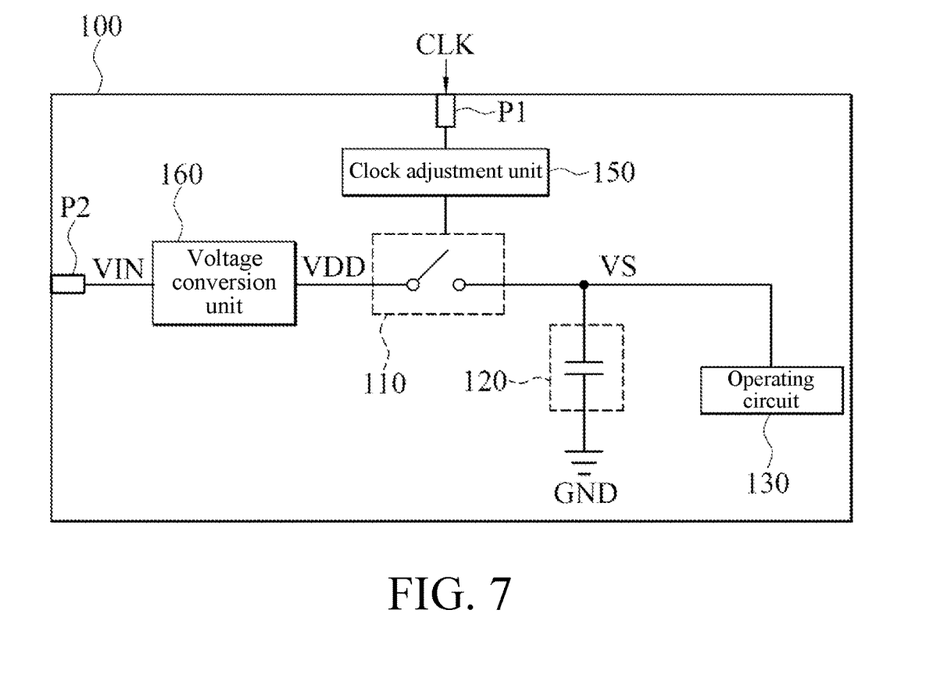
FIG. 7 is a schematic diagram of an embodiment of a circuit chip with power supply noise rejection.
Figure 8:
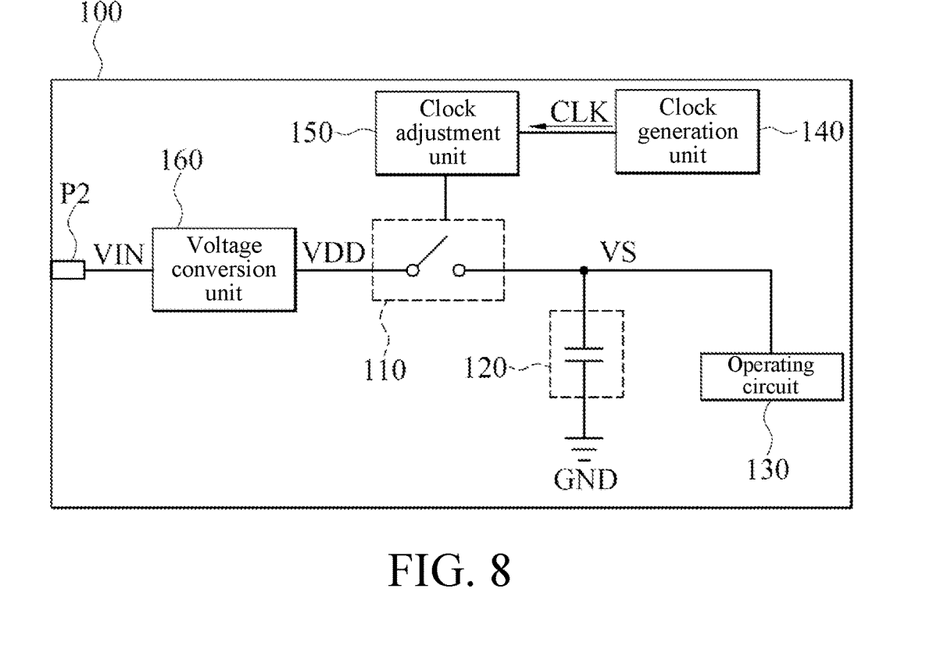
FIG. 8 is a schematic diagram of an embodiment of a circuit chip with power supply noise rejection.

FIG. 3 and FIG. 4 are schematic diagrams of an embodiment of a circuit chip 100 with power supply noise rejection. Referring to FIG. 3 and FIG. 4, in some embodiments, the circuit chip 100 may further include a clock adjustment unit 150. As shown in FIG. 3, the clock adjustment unit 150 may be coupled between the clock input pin P1 and the clock control terminal of the switch unit 110. Alternatively, as shown in FIG. 4, the clock adjustment unit 150 may be coupled between the clock generation unit 140 and the clock control terminal of the switch unit 110. The clock adjustment unit 150 may be configured to adjust the clock signal CLK, and the switch unit 110 selectively turns on the first connection path according to the clock signal CLK adjusted by the clock adjustment unit 150. In some embodiments, the adjustment may include, but is not limited to, time correction, duty cycle adjustment, frequency adjustment, and the like.

Referring to FIG. 1 to FIG. 4, in some embodiments, the circuit chip 100 may further include a power supply input pin P2, and the power supply input pin P2 is coupled to the first connection terminal of the switch unit 110. In some embodiments, the power supply input pin P2 may be configured to receive the power supply voltage VDD inputted externally to the circuit chip 100. However, the present invention is not limited thereto.

Referring to FIG. 5 to FIG. 8, in some other embodiments, the power supply input pin P2 is configured to receive an input voltage VIN inputted externally to the circuit chip 100. In addition, the circuit chip 100 may further include a voltage conversion unit 160. The voltage conversion unit 160 is coupled between the power supply input pin P2 and the first connection terminal of the switch unit 110, and the voltage conversion unit 160 is configured to convert the input voltage VIN into the power supply voltage VDD first, and then output the power supply voltage VDD to the first connection terminal of the switch unit 110. The same components and operations as those of the above embodiments are not described again.

In some embodiments, the voltage conversion unit 160 may be implemented by, but not limited to, a low-dropout (LDO) linear voltage regulator, a buck converter, a boost converter, or a combination thereof.

Figure 9:
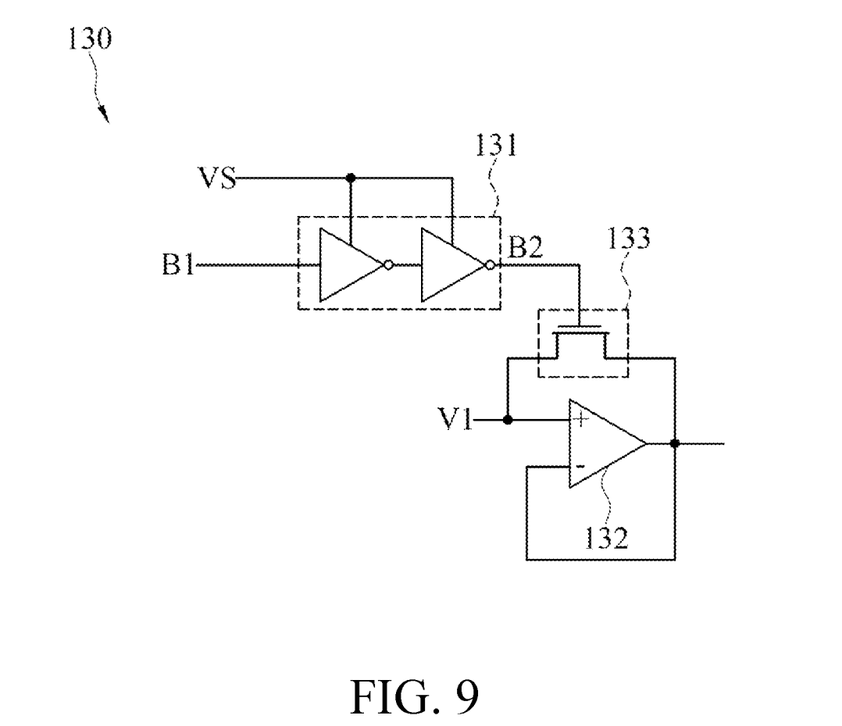
FIG. 9 is a schematic diagram of an embodiment of an operating circuit.

In some embodiments, the operating circuit 130 may be any circuit that needs to operate with a cleaner voltage (i.e., a voltage with less noise), to obtain a good PSRR. FIG. 9 is a schematic diagram of an embodiment of an operating circuit. Referring to FIG. 1 to FIG. 9, an example in which the operating circuit 130 is a unity gain buffer with a bypass mode is used for description below.

In some embodiments, the operating circuit 130 may include a buffer unit 131, an operational amplifier 132, and a bypass unit 133. The buffer unit 131 may have a buffer input terminal, a buffer output terminal, and a power supply connection terminal, and the power supply connection terminal of the buffer unit 131 is coupled to the second connection terminal of the switch unit 110. The operational amplifier 132 has a positive input terminal +, a negative input terminal −, and an operational output terminal, and the negative input terminal − of the operational amplifier 132 is coupled to the operational output terminal. The bypass unit 133 has a control terminal, a third connection terminal, and a fourth connection terminal. The control terminal of the bypass unit 133 is coupled to the buffer output terminal of the buffer unit 131. The third connection terminal of the bypass unit 133 is coupled to the positive input terminal + of the operational amplifier 132, and the fourth connection terminal of the bypass unit 133 is coupled to the operational output terminal of the operational amplifier 132.

The buffer unit 131 may operate by using a storage voltage VS received by the power connection terminal. Herein, the buffer unit 131 is configured to buffer a bypass signal B1 received by the buffer input terminal to generate a buffer signal B2, and output the buffer signal B2 to the control terminal of the bypass unit 133 through the buffer output terminal. The bypass unit 133 is configured to selectively turn on a second connection path between the third connection terminal and the fourth connection terminal according to the buffer signal B2 received by the control terminal.

In some embodiments, the bypass unit 133 may turn on the second connection path when a logic value of the buffer signal B2 is "1". When the second connection path is turned on, a first voltage V1 on the positive input terminal + of the operational amplifier 132 (or the third connection terminal of the bypass unit 133) may be bypassed to the operational output terminal of the operational amplifier 132 (or the fourth connection terminal of the bypass unit 133) through the second connection path of the bypass unit 133. In addition, the bypass unit 133 may cut off the second connection path when a logic value of the buffer signal B2 is "0". When the second connection path is cut off, the operational amplifier 132 operates as a conventional unity gain buffer in this case.

It is noted that how the bypass unit 133 selectively turns on the second connection path according to the buffer signal B2 may be determined depending on design requirements. For example, the bypass unit 133 may alternatively cut off the second connection path when the logic value of the buffer signal B2 is "1", and turn on the second connection path when the logic value of the buffer signal B2 is "0".

In some embodiments, although there is a parasitic capacitance between the control terminal and the third connection terminal of the bypass unit 133 and between the control terminal and the fourth connection terminal, because the power supply noise of the storage voltage VS on the second connection terminal of the energy storage unit 120 has been greatly reduced, noise transmitted to the operational output terminal of the operational amplifier 132 through the parasitic capacitance of the bypass unit 133 is also greatly reduced, so that the operating circuit 130 has a good PSRR.

In some embodiments, the buffer unit 131 may include one or more cascaded inverters. Herein, only two cascades are shown, but the number of cascades is not limited thereto and may be determined by a required driving force and/or a logic value. In addition, the bypass unit 133 may include at least one transistor. In some embodiments, the transistor may be implemented by, but not limited to, an MOSFET, a BJT, a GaN FET or an IGBT.

In some embodiments, a duty cycle and frequency of the clock signal CLK and a capacitance of the energy storage unit 120 may be adjusted according to a load required by the operating circuit 130. In an example where the operating circuit 130 is a unity gain buffer with a bypass mode, if a loading frequency of the buffer unit 131 of the operating circuit 130 is 3 gigahertz (MHz) and a loading amount is small, the duty cycle of the clock signal CLK may be 8.3%, the frequency of the clock signal CLK may be 3 MHz, and a capacitance value of the energy storage unit 120 may be 1 picofarad (pF). However, the present invention is not limited thereto.

Figure 10:
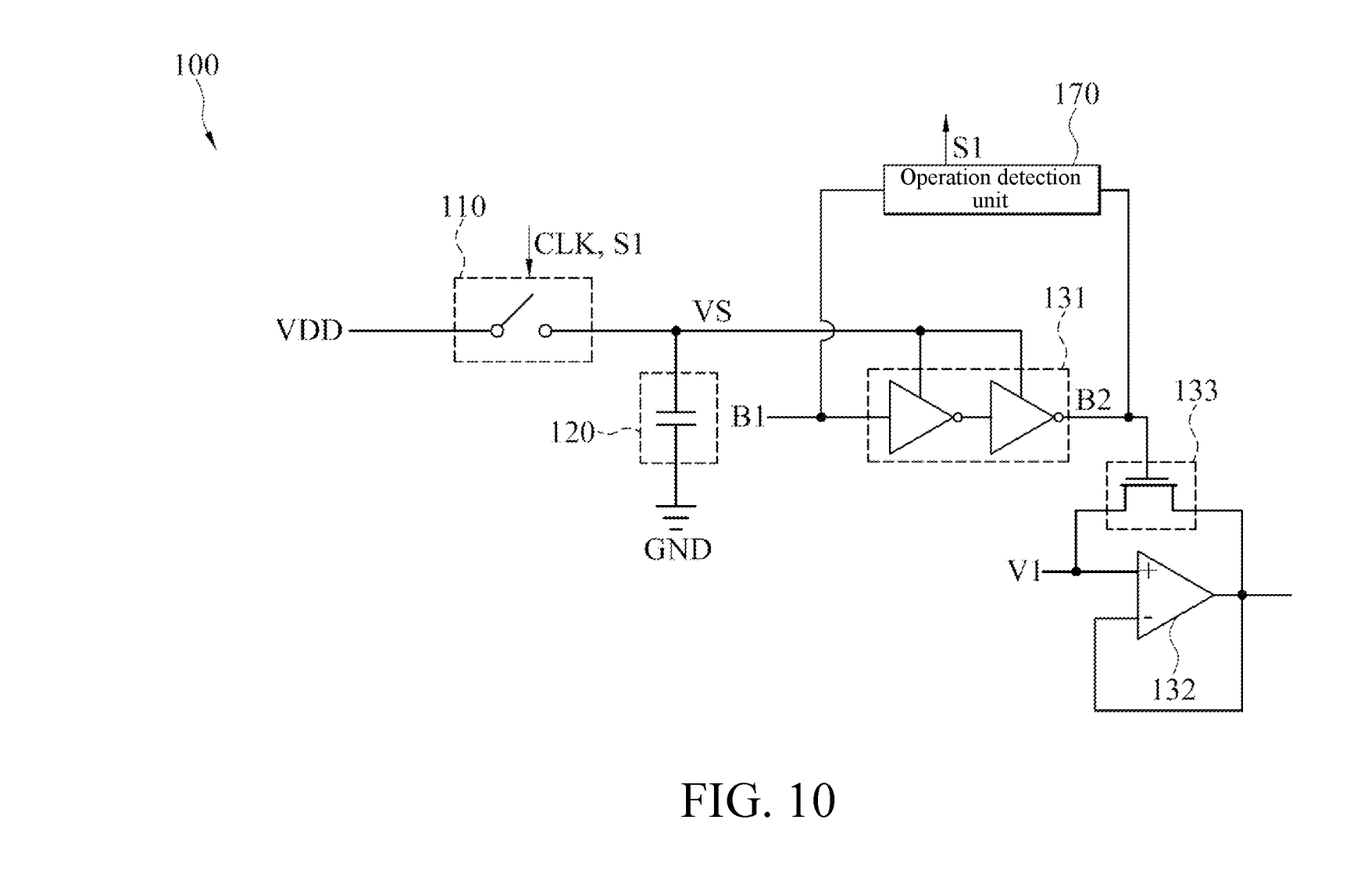
FIG. 10 is a schematic diagram of an embodiment of a circuit chip with power supply noise rejection.

FIG. 10 is a schematic diagram of an embodiment of a circuit chip 100 with power supply noise rejection. Referring to FIG. 10, in some embodiments, the circuit chip 100 may further include an operation detection unit 170. The operation detection unit 170 is coupled to the operating circuit 130 and the switch unit 110. The operation detection unit 170 is configured to detect whether the operating circuit 130 operates normally, and may cause the switch unit 110 to turn on the first connection path when it is determined that the operation is abnormal, so that the energy storage unit 120 may store energy again according to the power supply voltage VDD transmitted to the second connection terminal.

In some embodiments, the operation detection unit 170 may be coupled to the buffer input terminal and the buffer output terminal of the buffer unit 131, to determine, according to logic values of the bypass signal B1 and the buffer signal B2, whether the operating circuit 130 operates normally. When it is determined that the operation is abnormal, the operation detection unit 170 may generate a turn-on signal S1 to the switch unit 110, to cause the switch unit 110 to turn on the first connection path.

In some embodiments, the operation detection unit 170 may be implemented by a digital logic gate. For example, when the buffer unit 131 includes two cascades of inverters, and the operation detection unit 170 may be implemented by an exclusive or gate (XOR gate) However, the present invention is not limited thereto.

Figure 11:
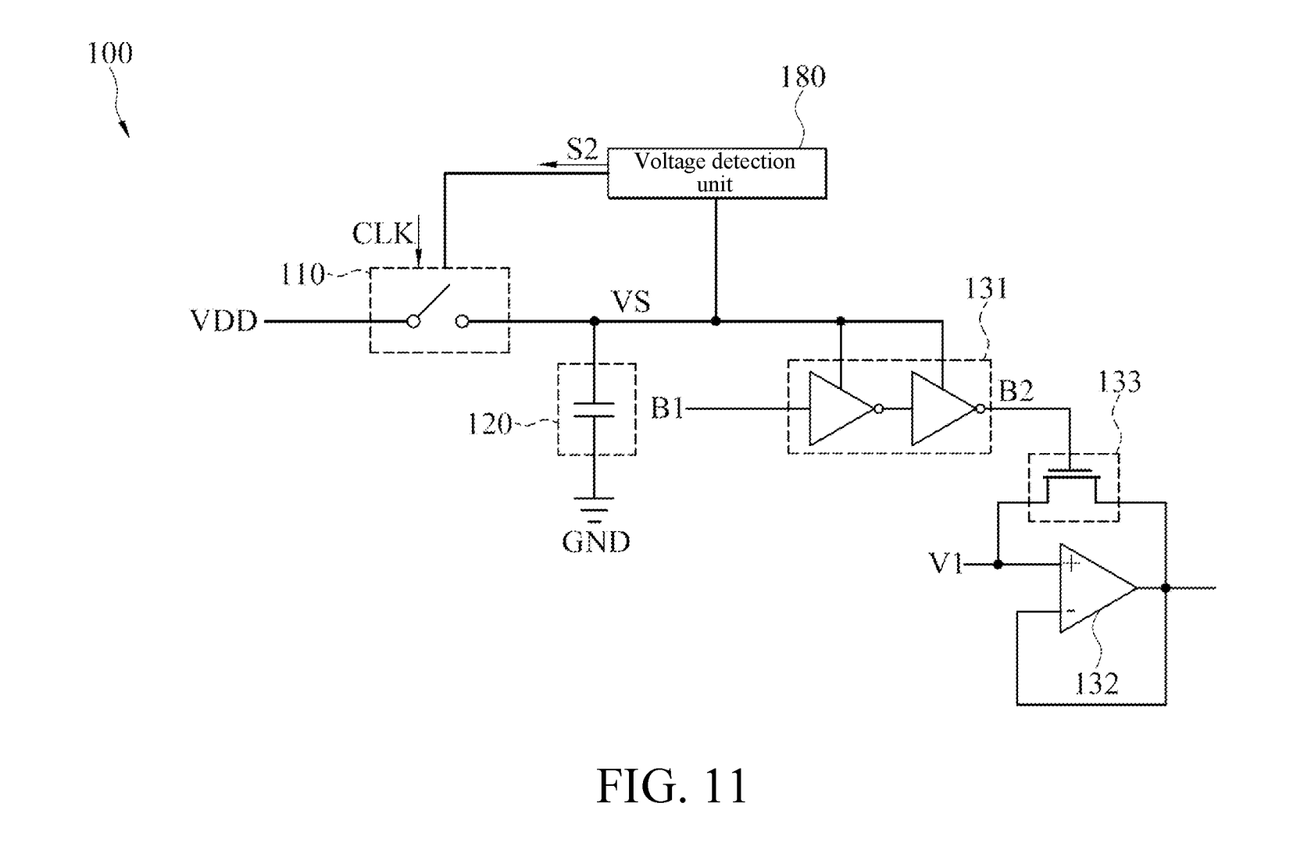
FIG. 11 is a schematic diagram of an embodiment of a circuit chip with power supply noise rejection.

FIG. 11 is a schematic diagram of an embodiment of a circuit chip 100 with power supply noise rejection. Referring to FIG. 11, in some embodiments, the circuit chip 100 may further include a voltage detection unit 180. The voltage detection unit 180 is coupled to the clock control terminal and the second connection terminal of the switch unit 110. The voltage detection unit 180 is configured to detect the storage voltage VS that is on the second connection terminal and that is generated by the energy storage unit 120, and determine whether the storage voltage VS exceeds a voltage threshold. When it is determined that the storage voltage VS does not exceed the voltage threshold, the voltage detection unit 180 may generate a turn-on signal S2 to the switch unit 110, to cause the switch unit 110 to turn on the first connection path, so that the energy storage unit 120 may store energy again according to the power supply voltage VDD transmitted to the second connection terminal.

In some embodiments, the voltage detection unit 180 may be implemented by, for example, a comparator, but is not limited thereto. In addition, the voltage threshold may be, but is not limited to, one-half of the power supply voltage VDD.

Based on the above, in a circuit chip with power supply noise rejection of the embodiments of the present invention, a first connection path of a switch unit is temporarily turned on, so that after an energy storage unit generates, during the connection, a storage voltage on a second connection terminal according to a power supply voltage, and the first connection path of the switch unit is then cut off, so that power supply noise of the power supply voltage can no longer be transmitted to the second connection terminal. In this way, the power supply noise of the storage voltage may be greatly reduced to achieve a power supply noise rejection effect. In addition, an operating circuit that operates according to the storage voltage may have a good PSRR due to the low power supply noise of the storage voltage. Furthermore, compared with a design that uses a conventional low-pass filter including a resistor and a capacitor to filter out power supply noise, a large layout area may be saved in the circuit chip with power supply noise rejection of the embodiments of the present invention because no resistor is required, and an excessively long settling time caused by a large resistor may be avoided.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A circuit chip with power supply noise rejection, comprising:
    a switch unit, having a first connection terminal and a second connection terminal, wherein the first connection terminal is adapted to receive a power supply voltage, and the switch unit is configured to selectively turn on a first connection path between the first connection terminal and the second connection terminal according to a clock signal;
    an energy storage unit, coupled to the second connection terminal of the switch unit, wherein when the switch unit turns on the first connection path, the energy storage unit is configured to generate a storage voltage on the second connection terminal according to the power supply voltage;
    an operating circuit, coupled to the second connection terminal and configured to operate according to the storage voltage; and
    an operation detection unit, coupled to the operating circuit and the switch unit, wherein the operation detection unit is configured to detect whether the operating circuit operates normally, and when the operation detection unit determined that the operating circuit operates abnormally, the operation detection unit cause the switch unit to turn on the first connection path.

2. The circuit chip with power supply noise rejection according to claim 1, further comprising:
    a clock generation unit, configured to generate the clock signal.

3. The circuit chip with power supply noise rejection according to claim 1, further comprising:
    a clock input pin, configured to receive the clock signal inputted externally.

4. The circuit chip with power supply noise rejection according to claim 2, further comprising:
    a clock adjustment unit, configured to adjust the clock signal, wherein the switch unit is configured to selectively turn on the first connection path between the first connection terminal and the second connection terminal according to the clock signal adjusted by the clock adjustment unit.

5. The circuit chip with power supply noise rejection according to claim 4, further comprising:
    a power supply input pin, configured to receive the power supply voltage inputted externally.

6. The circuit chip with power supply noise rejection according to claim 4, further comprising:
    a power supply input pin, configured to receive an input voltage inputted externally; and
    a voltage conversion unit, configured to convert the input voltage into the power supply voltage.

7. The circuit chip with power supply noise rejection according to claim 3, further comprising:
    a clock adjustment unit, configured to adjust the clock signal, wherein the switch unit is configured to selectively turn on the first connection path between the first connection terminal and the second connection terminal according to the clock signal adjusted by the clock adjustment unit.

8. The circuit chip with power supply noise rejection according to claim 7, further comprising:
    a power supply input pin, configured to receive the power supply voltage inputted externally.

9. The circuit chip with power supply noise rejection according to claim 7, further comprising:
    a power supply input pin, configured to receive an input voltage inputted externally; and
    a voltage conversion unit, configured to convert the input voltage into the power supply voltage.

10. The circuit chip with power supply noise rejection according to claim 1, wherein the operating circuit comprises:
    a buffer unit, having a buffer input terminal and a buffer output terminal, wherein the buffer input terminal receives a bypass signal, and the buffer unit is configured to operate according to the storage voltage to buffer the bypass signal as a buffer signal;
    an operational amplifier, having a positive input terminal, a negative input terminal, and an operational output terminal, wherein the negative input terminal is coupled to the operational output terminal; and
    a bypass unit, having a control terminal, a third connection terminal, and a fourth connection terminal, wherein the control terminal is coupled to the buffer output terminal, the third connection terminal is coupled to the positive input terminal, the fourth connection terminal is coupled to the operational output terminal, and the bypass unit is configured to selectively turn on a second connection path between the third connection terminal and the fourth connection terminal according to the buffer signal received by the control terminal.

* * * * *